US012581865B2

(12) United States Patent
Chuang et al.

(10) Patent No.: US 12,581,865 B2
(45) Date of Patent: Mar. 17, 2026

(54) MANUFACTURING METHOD OF PACKAGE WITH MAGNETIC SHIELDING STRUCTURE

(71) Applicant: TAIWAN SEMICONDUCTOR MANUFACTURING COMPANY, LTD., Hsinchu (TW)

(72) Inventors: Harry-Hak-Lay Chuang, Hsinchu County (TW); Yuan-Jen Lee, Hsinchu City (TW); Tien-Wei Chiang, Taipei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 305 days.

(21) Appl. No.: 17/237,513

(22) Filed: Apr. 22, 2021

(65) Prior Publication Data

US 2022/0344578 A1      Oct. 27, 2022

(51) Int. Cl.
| | |
|---|---|
| *H10N 50/80* | (2023.01) |
| *G11C 11/16* | (2006.01) |
| *H01L 23/552* | (2006.01) |
| *H10N 50/01* | (2023.01) |

(52) U.S. Cl.
CPC ........... *H10N 50/80* (2023.02); *G11C 11/161* (2013.01); *H01L 23/552* (2013.01); *H10N 50/01* (2023.02)

(58) Field of Classification Search
CPC ...... H10N 50/80; H10N 50/01; G11C 11/161; H01L 23/552
See application file for complete search history.

(56) References Cited

U.S. PATENT DOCUMENTS

| | | | | |
|---|---|---|---|---|
| 10,074,799 B2 * | 9/2018 | Jang | ...................... | H01L 23/552 |
| 10,109,596 B2 * | 10/2018 | Takaku | ................. | H01L 23/552 |
| 10,290,678 B2 * | 5/2019 | Gao | ....................... | H10B 61/00 |
| 10,506,704 B1 * | 12/2019 | Embar | ................. | H05K 1/0216 |
| 10,644,225 B2 * | 5/2020 | Fujimori | ................ | H10N 50/10 |
| 2005/0116255 A1 * | 6/2005 | Kato | ....................... | H10B 61/00 |
| | | | | 257/E27.005 |
| 2005/0226030 A1 * | 10/2005 | Kato | ...................... | H01L 23/552 |
| | | | | 257/E23.114 |
| 2006/0043539 A1 * | 3/2006 | Thomas | ............. | H01L 23/552 |
| | | | | 257/659 |
| 2006/0244120 A1 * | 11/2006 | Gospodinova-Daltcheva | ............ | |
| | | | | H01L 24/33 |
| | | | | 257/E23.079 |
| 2008/0122047 A1 * | 5/2008 | Honer | ................... | H01L 23/552 |
| | | | | 257/659 |

(Continued)

OTHER PUBLICATIONS

Wang et al., "Impact of external magnetic field on embedded perpendicular STT-MRAM technology qualified for solder reflow", 2017 IEEE International Electron Devices Meeting (IEDM), pp. 21.1.1-21.1.4.

*Primary Examiner* — Norman D Richards
*Assistant Examiner* — Sean Ayers Winters
(74) *Attorney, Agent, or Firm* — Birch, Stewart, Kolasch & Birch, LLP

(57) ABSTRACT

A package structure includes an integrated circuit package and a magnetic shielding structure. The integrated circuit package includes a semiconductor chip. The magnetic shielding structure surrounds the integrated circuit package, in which the magnetic shielding structure including a top plate and a bottom plate disposed on two opposite sides of the integrated circuit package.

20 Claims, 7 Drawing Sheets

300

(56)         References Cited

U.S. PATENT DOCUMENTS

| | | | | |
|---|---|---|---|---|
| 2010/0270660 | A1* | 10/2010 | Masuda | .................. H01L 23/16 |
| | | | | 257/659 |
| 2010/0276791 | A1* | 11/2010 | Kaneko | .............. H01L 23/5227 |
| | | | | 257/659 |
| 2010/0290191 | A1* | 11/2010 | Lin | ......................... H01L 24/82 |
| | | | | 361/764 |
| 2013/0002291 | A1* | 1/2013 | Park | ..................... H03K 19/003 |
| | | | | 326/30 |
| 2014/0084456 | A1* | 3/2014 | Kang | ..................... H01L 25/50 |
| | | | | 257/737 |
| 2014/0225208 | A1* | 8/2014 | Gu | ......................... H10B 61/22 |
| | | | | 257/422 |
| 2018/0049311 | A1* | 2/2018 | Hoang | ................ H01L 25/0652 |
| 2019/0221732 | A1* | 7/2019 | Houssameddine | ..... G11C 11/16 |
| 2020/0006245 | A1* | 1/2020 | Chuang | ............. H01L 23/49555 |
| 2020/0411449 | A1 | 12/2020 | Chuang et al. | |
| 2021/0043544 | A1* | 2/2021 | Eid | .................... H03H 9/02102 |

* cited by examiner

300a

210a ⎫
220a ⎬ 200a
230a ⎭

210a

230a

140

220a

100

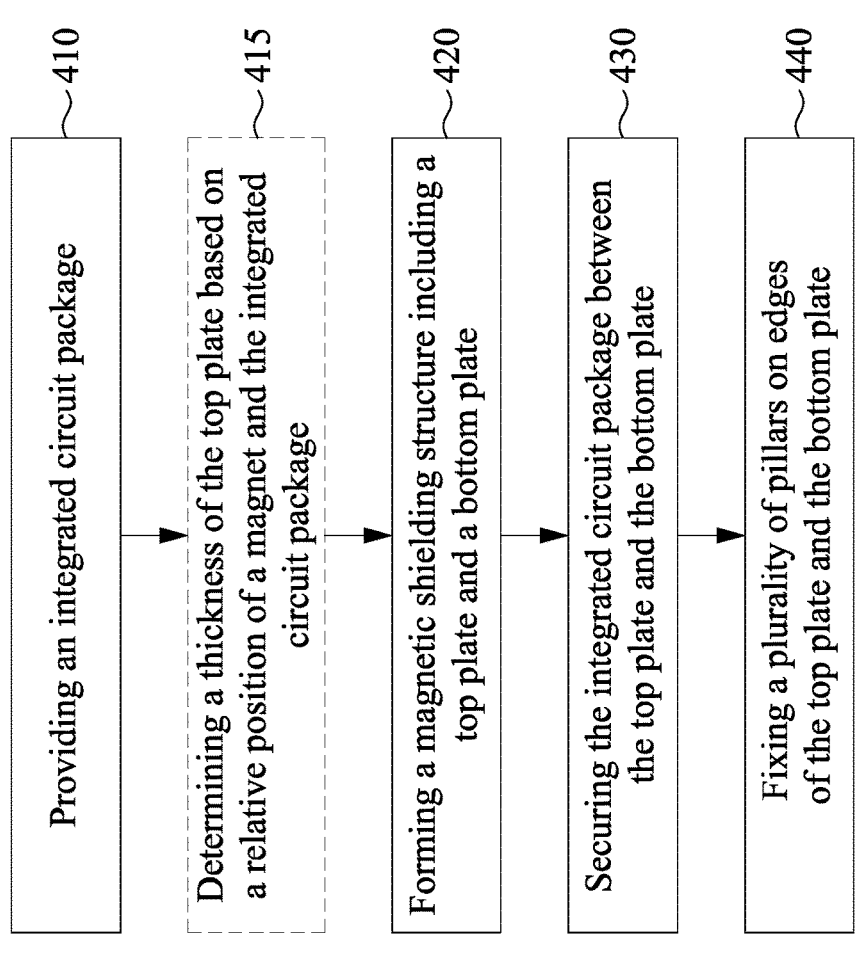

400

410 — Providing an integrated circuit package

415 — Determining a thickness of the top plate based on a relative position of a magnet and the integrated circuit package 420 — Forming a magnetic shielding structure including a top plate and a bottom plate 430 — Securing the integrated circuit package between the top plate and the bottom plate 440 — Fixing a plurality of pillars on edges of the top plate and the bottom plate

Fig. 6

MANUFACTURING METHOD OF PACKAGE WITH MAGNETIC SHIELDING STRUCTURE

BACKGROUND

In the semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased as a result of decreasing minimum feature size or geometry sizes (i.e., the smallest component (or line) that can be created using a fabrication process). Such scaling down has also increased the complexity of IC processing and manufacturing.

One type of semiconductor devices is the semiconductor storage device, such as magnetic random access memories (MRAMs). Some of the recent development pertinent to semiconductor devices such as MRAMs involves spin electronics, which combines semiconductor technology and magnetic materials and devices. The spin polarization of electrons, rather than the charge of the electrons, is used to indicate the state of "1" or "0." One such spin electronic device is a spin torque transfer (STT) magnetic tunneling junction (MTJ). The MTJ may change its resistive state based on the state of magnetic materials within the device. The MTJ includes a pinning layer, a tunnel barrier layer, and a free layer. The magnetization direction of the free layer can be reversed by applying a current through the tunnel barrier layer, which causes the injected polarized electrons within the free layer to exert so-called spin torques on the magnetization of the free layer. The pinned layer has a fixed magnetization direction. When current flows in the direction from the free layer to the pinned layer, electrons flow in a reverse direction, that is, from the pinned layer to the free layer. The electrons are polarized to the same magnetization direction of the pinned layer after passing the pinned layer; flowing through the tunnel barrier layer; and then into and accumulating in the free layer. Eventually, the magnetization of the free layer is parallel to that of the pinned layer, and MTJ will be at a low resistance state. The electron injection caused by current is referred to as a major injection.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a flow chart of a method of manufacturing a package structure in accordance with some embodiments of the present disclosure.

DETAILED DESCRIPTION

Figure 1:
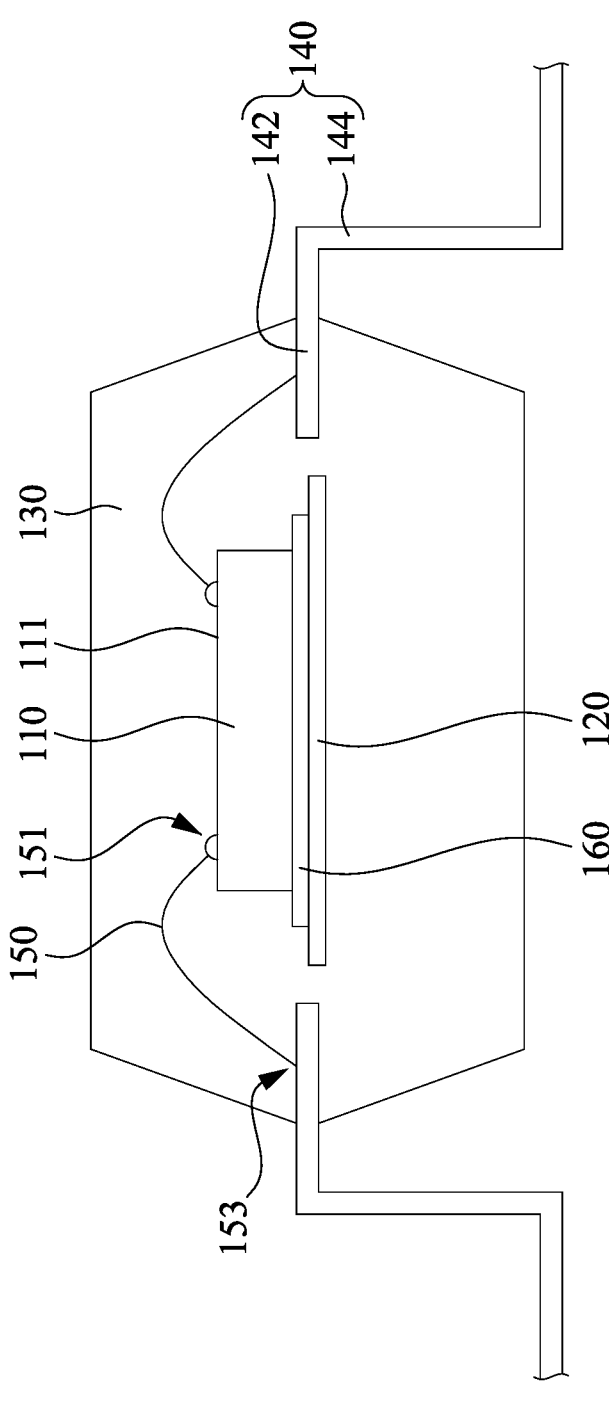
FIG. 1 is a cross-sectional view of an integrated circuit package in accordance with some embodiments of the present disclosure.

The following disclosure provides many different embodiments, or examples, for implementing different features of the provided subject matter. Specific examples of components and arrangements are described below to simplify the present disclosure.

These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximated, meaning that the term "around", "about", "approximately", or "substantially" can be inferred if not expressly stated.

Some embodiments of this disclosure relate to a package structure and more specifically to the package structure including an integrated circuit package and a magnetic shielding structure surrounding the integrated circuit package. Because the shielding structure surrounds the integrated circuit package, the magnetic shielding structure can reduce interference at a semiconductor chip caused by an external magnetic field.

FIG. 1 is a cross-sectional view of an integrated circuit package 100 in accordance with some embodiments of the present disclosure. The integrated circuit package 100 includes a semiconductor chip 110, a conductive pad 120, a molding material 130, a plurality of pins 140, and a plurality of bonding wires 150. The conductive pad 120 is configured to support the semiconductor chip 110. The molding material 130 surrounds the semiconductor chip 110 and the conductive pad 120. The pins 140 protrude from the molding material 130. Each of the bonding wires 150 is electrically connected between the semiconductor chip 110 and one of the pins 140. In some embodiments, the integrated circuit package 100 is any type of semiconductor device package, including, for example, integrated fan out (InFO) packages, chip-on-wafer-on-substrate (CoWoS) packages, wire bond packages, ball grid array packages, flip chip packages, or other types of semiconductor device packages.

The semiconductor chip 110 may be or include any electrical circuitry, components, features or the like which may be formed on or in a semiconductor material, such as a monocrystalline silicon (Si), amorphous Si, gallium arsenide (GaAs), or any other semiconductor material or semiconductor substrate. In some embodiments, the semiconductor chip 110 is a magnetic sensitive chip that is sensitive to magnetic fields. For example, the semiconductor chip 110 includes one or more electrical circuitry, components, features or the like which may be operationally affected by magnetic fields, such as may exist when a magnetic is brought into close proximity of the integrated circuit package 100. In some embodiments, the semiconductor chip 110 is a magnetic sensitive memory chip, such as a magnetic random access memory (MRAM) chip. In contrast to random access memory (RAM) chip, data in MRAM is stored by magnetic storage elements as opposed to storage as electric charge or current flows. The magnetic storage elements are formed from two ferromagnetic memory layers, each of which can hold a magnetization, separated by a thin insulating layer. One of the two ferromagnetic memory layers may be a permanent magnet set to a particular polarity, while the other ferromagnetic memory layer may have a variable magnetization which can be changed based on application of an external field to store data. Due to the use of magnetic storage elements in an MRAM chip, such MRAM chips are particularly susceptible to unintended effects due to the presence of an external magnetic field caused, for example, by a magnetic being brought into proximity of the MRAM chip.

The conductive pad 120 is disposed under the semiconductor chip 110 to support the semiconductor chip 110. In some embodiments, the semiconductor chip 110 is attached to the conductive pad 120 by an adhesive layer 160. In some other embodiments, the semiconductor chip 110 is in contact with the conductive pad 120. The molding material 130 may encapsulate the semiconductor chip 110 and the conductive pad 120. In some embodiments, the molding material 130 is an epoxy mold compound (EPC). In some embodiments, the molding material 130 includes polymers such as plastic compounds, or the like. The molding material 130 may be formed of an electrically insulating material or a thermally insulating material. In some embodiments, the molding material 130 may mitigate defects from outside and enhance the mechanical strength of the integrated circuit package 100. However, in some cases, the molding material 130 may not effectively alleviate the affection of external magnetic field on the semiconductor chip 110, further inducing malfunction.

Each of the pins 140 protrudes from the molding material 130 and may be electrically connected to external circuitries. In some embodiments, each of the pins 140 has a first portion 142 and a second portion 144. The first portion 142 of each of the pins 140 is encapsulated by the molding material 130 and the second portion 144 of each of the pins 140 is not covered by the molding material 130.

In some embodiments, the conductive pad 120 and the pins 140 are metal members. These metal members are made of a ferromagnetic material such as iron (Fe), nickel (Ni) or cobalt (Co), or an alloy material including any one of these ferromagnetic materials as the main component and may be coated with another metal material. Alternatively, these metal members may be made of a non-magnetic material such as copper (Cu) and may be coated with any one of the above ferromagnetic materials or alloy material.

Each of the bonding wires 150 is electrically connected between the semiconductor chip 110 and the first portion 142 of the pin 140. The bonding wires 150 are encapsulated by the molding material 130. In some embodiments, each of the bonding wires 150 has a first bonding surface 151 and a second bonding surface 153 respectively in contact with the semiconductor chip 110 and the pins 140. In other words, each of the bonding wires 150 is connected to the semiconductor chip 110 through the first bonding surface 151, wherein the first bonding surface 151 is a portion of a top surface 111 of the semiconductor chip 110. For example, ball bonding is one of the methods for attaching the bonding wires 150 to the semiconductor chip 110 through the first bonding surface 151. The bonding wires 150 may be fed by a capillary, and a combination of heat, pressure, and/or ultrasonic energy may be used to make a weld at the end of each of the bonding wires 150. For example, a bonding ball is formed at the tip of the capillary, and a combination of heat, pressure, and/or ultrasonic energy may form a weld between the bonding ball and the first bonding surface 151. The capillary may be subsequently moved to the second bonding surface 153 on the pins 140. A combination of ultrasonic vibration, pressure, and/or heat may be applied to crush the bonding wires 150 on the second bonding surface 153, which is referred as tail bond or second bond.

In some embodiments, a substrate (or the external circuitries mentioned above) is configured to support the integrated circuit package 100. For example, in some embodiments, the integrated circuit package 100 is mechanically coupled to the substrate. In some embodiments, the substrate is electrically coupled to the integrated circuit package 100, e.g., to the semiconductor chip 110 included within the integrated circuit package 100. In some embodiments, the substrate is a printed circuit board (PCB) having one or more electrical contacts or conductive pads that electrically couple the substrate to one or more corresponding electrical contacts or conductive pads of the integrated circuit package 100. The substrate may be electrically coupled to additional electrical devices, packages or the like, which in some embodiments, may be electrically coupled to the integrated circuit package 100 via the substrate.

Figure 2:
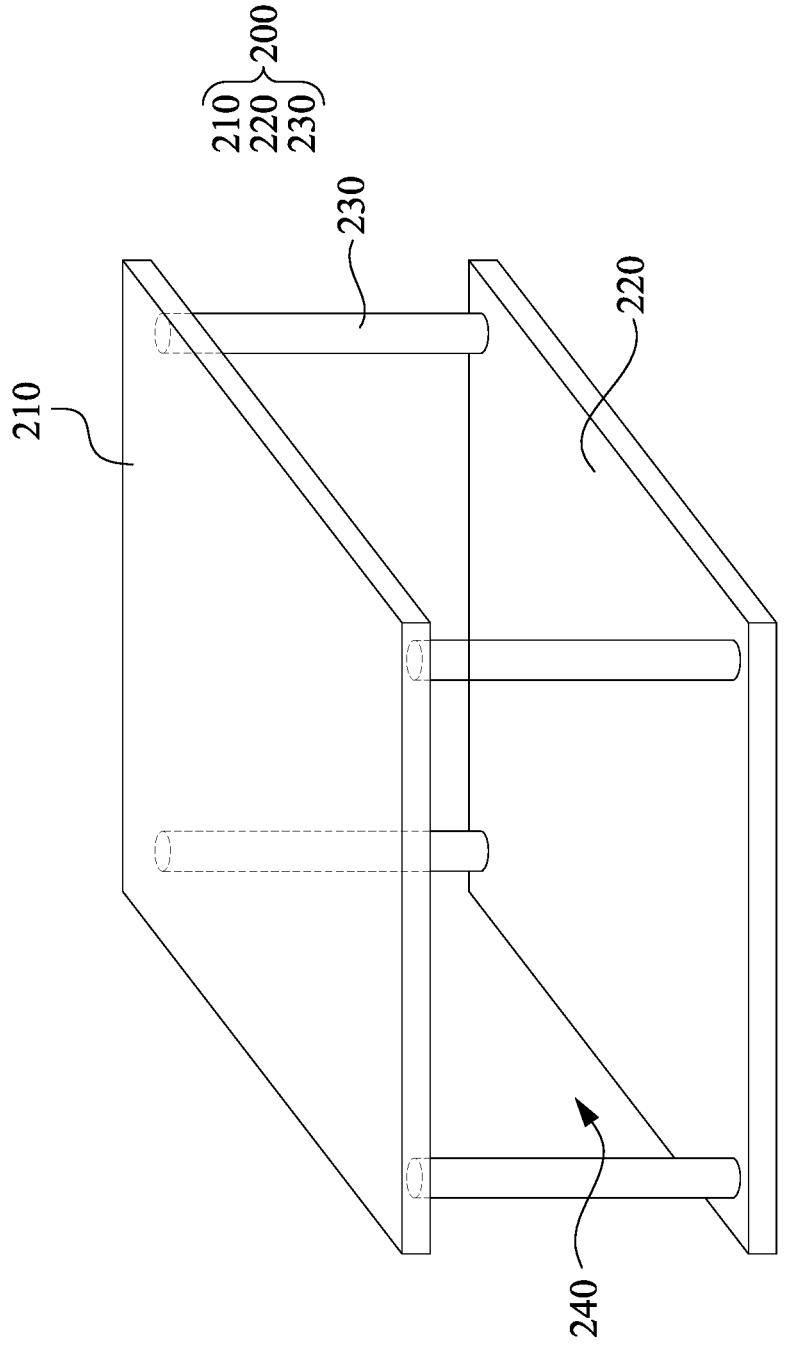
FIG. 2 is a schematic view of a magnetic shielding structure in accordance with some embodiments of the present disclosure.
Figures 3A, 3B:
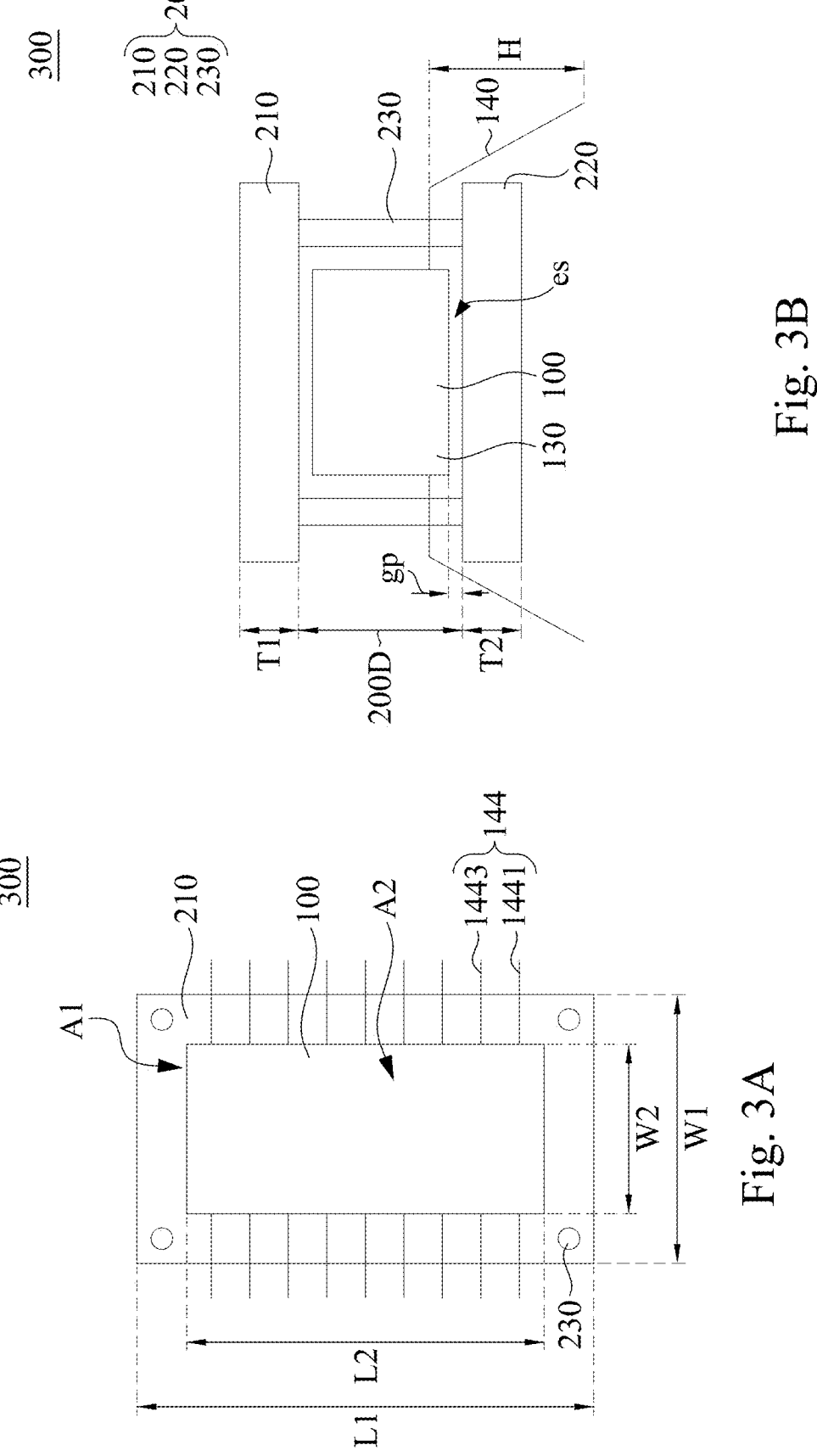
FIG. 3A and FIG. 3B are respectively top and cross-sectional views of a package structure in accordance with some embodiments of the present disclosure.

FIG. 2 is a schematic view of a magnetic shielding structure 200 in accordance with some embodiments of the present disclosure. FIG. 3A and FIG. 3B are respectively top and cross-sectional views of a package structure 300 in accordance with some embodiments of the present disclosure. Reference is made to FIG. 1 to FIG. 3B. The magnetic shielding structure 200 is disposed outside the integrated circuit package 100. In greater details, the magnetic shielding structure 200 surrounds the integrated circuit package 100 to shield the integrated circuit package 100 (especially the semiconductor chip 110) from magnetic interference or the like, for example, as may be caused by a magnet brought into proximity of the package structure 300. More particularly, in some embodiments, the magnetic shielding structure 200 serves to redirect magnetic flux (e.g., from a magnet or magnetic structure positioned near the package structure 300) and significantly reduce magnetic interference on magnetic sensitive devices, such as the semiconductor chip 110. It is noted that the integrated circuit package 100 inside the magnetic shielding structure 200 is omitted for clarity in FIGS. 3A and 3B.

The magnetic shielding structure 200 includes a top plate 210 and a bottom plate 220. The top plate 210 of the magnetic shielding structure 200 is disposed over the integrated circuit package 100 and the bottom plate 220 of the magnetic shielding structure 200 is disposed below the integrated circuit package 100, such that the integrated circuit package 100 is surrounded/covered by the magnetic shielding structure 200. Also, the integrated circuit package 100 is sandwiched between the top plate 210 and the bottom plate 220. In some embodiments, the magnetic shielding structure 200 further includes a plurality of pillars 230 to connect the top plate 210 and the bottom plate 220. For example, the magnetic shielding structure 200 includes four pillars 230 disposed on edges of the top plate 210 and the bottom plate 220. As such, the top plate 210, the bottom plate 220, and the pillars 230 of the magnetic shielding structure 200 together form a magnetic shielding box structure.

The top plate 210 and the bottom plate 220 of the magnetic shielding structure 200 may be formed of any material suitable to redirect magnetic flux and reduce magnetic interference on magnetic sensitive devices (e.g., the semiconductor chip 110 of the integrated circuit package 100). In some embodiments, the top plate 210 and the bottom plate 220 of the magnetic shielding structure 200 include a first material (e.g., a magnetic material) including at least one of: iron (Fe), cobalt (Co), nickel (Ni), or any combination thereof. In some embodiments, the top plate 210 and the bottom plate 220 of the magnetic shielding structure 200 include $Ni_xFe_{(100-x)}$, in which a ratio of Ni (i.e., x) is in a range of 50 to 100. In some embodiments, the top plate 210 and the bottom plate 220 of the magnetic shielding structure 200 include $Co_xNi_{(100-x)}$, in which a ratio of Co (i.e., x) is in a range of 50 to 100. In some embodiments, the top plate 210 and the bottom plate 220 of the magnetic shielding structure 200 include $Co_xFe_{(100-x)}$, in which a ratio of Co (i.e., x) is in a range of 50 to 100.

The top plate 210 and the bottom plate 220 of the magnetic shielding structure 200 may further include a second material (e.g., a doping material) including at least one of: copper (Cu), molybdenum (Mo), carbon (C), silicon (Si), chromium (Cr), copper (Cu), niobium (Nb), titanium (Ti), manganese (Mn), aluminum (Al), tungsten (W), or vanadium (V). In some embodiments, the top plate 210 and the bottom plate 220 of the magnetic shielding structure 200 is formed of 80% to 100% of the first material and 0% to 20% of the second material. In some embodiments, the top plate 210 and the bottom plate 220 of the magnetic shielding structure 200 includes 80% to 100% of CoFe and 0% to 20% of Si, which may be a dopant element. In some embodiments, the top plate 210 and the bottom plate 220 of the magnetic shielding structure 200 is silicon-steel (or electrical steel).

In some embodiments, the pillars 230 of the magnetic shielding structure 200 include the same materials as the top plate 210 and the bottom plate 220 of the magnetic shielding structure 200. In some other embodiments, the pillars 230 of the magnetic shielding structure 200 include different materials from the top plate 210 and the bottom plate 220 of the magnetic shielding structure 200. For example, the top plate 210 and the bottom plate 220 of the magnetic shielding structure 200 include magnetic materials, while the pillars 230 of the magnetic shielding structure 200 include non-magnetic materials, such as plastic, stainless steel, ceramic, combinations thereof, or the like. In some embodiments, the pillars 230 may be made of a material harder or more firmly than the material of the top plate 210 and the bottom plate 220, such that the pillars 230 can fix the positions of the top plate 210 and the bottom plate 220.

In some embodiments, the magnetic shielding structure 200 is secured in or fixed on the substrate, in which the integrated circuit package 100 is fixed on the same substrate, such that the integrated circuit package 100 is disposed in the magnetic shielding structure 200. For example, a bottom surface of the bottom plate 220 of the magnetic shielding structure 200 is secured on the substrate, and then the pins 140 of the integrated circuit package 100 are secured in or fixed on circuits of the substrate, or vice versa. In some embodiments, the top plate 210, the bottom plate 220, and the pillars 230 of the magnetic shielding structure 200 form an accommodate space 240. The integrated circuit package 100 is disposed in the accommodate space 240. For example, the top plate 210 and the bottom plate 220 are disposed on two opposite sides of the integrated circuit package 100.

As shown in FIG. 3A, the top plate 210 of the magnetic shielding structure 200 may have a length L1 and a width W1. The length L1 of the top plate 210 of the magnetic shielding structure 200 is greater than a length L2 of the integrated circuit package 100 in a first direction, and the width W1 of the top plate 210 of the magnetic shielding structure 200 is greater than a width W2 of the integrated circuit package 100 in a second direction perpendicular to the first direction. As such, the magnetic shielding structure 200 completely overlaps the integrated circuit package 100.

Similarly, the bottom plate 220 of the magnetic shielding structure 200 may have a length substantially the same as the length L1 and a width substantially the same as the width W1. The length of the bottom plate 220 of the magnetic shielding structure 200 is greater than the length L2 of the integrated circuit package 100 in the first direction, and the width of the bottom plate 220 of the magnetic shielding structure 200 is greater than the width W2 of the integrated circuit package 100 in the second direction.

In some embodiments, a surface area A1 (i.e., the length L1 multiply the width W1) of the top plate 210 of the magnetic shielding structure 200 is greater than a surface area A2 (i.e., the length L2 multiply the width W2) of the integrated circuit package 100. Similarly, the bottom plate 220 of the magnetic shielding structure 200 may have a surface area substantially the same as the surface area A1 of the top plate 210. The surface area of the bottom plate 220 of the magnetic shielding structure 200 is greater than a surface area A2 of the integrated circuit package 100.

In some embodiments, the pins 140 are electrically connected to the integrated circuit package 100 and the external circuitries. The pillars 230 of the magnetic shielding structure 200 are disposed on the edges of the top plate 210 of the magnetic shielding structure 200. In some embodiments, the pillars 230 of the magnetic shielding structure 200 are disposed between two adjacent pins 140 (e.g., the pins 1441 and 1443).

Further, as shown in FIG. 3B, the pins 140 have a height H greater than the thickness T2 of the bottom plate 220. That is, bottom ends of the pins 140 are lower than a bottom surface of the bottom plate 220. Moreover, in some embodiments, the top plate 210 is spaced apart from the bottom plate 220 by a distance 200D less than the height H of the pins 140. The pins 140 are benefit to fix the integrated circuit package 100 inside the magnetic shielding structure 200, and the integrated circuit package 100 does not detach from the magnetic shielding structure 200.

As shown in FIG. 3B, the top plate 210 of the magnetic shielding structure 200 may has a thickness T1 to redirect magnetic flux and reduce magnetic interference on magnetic sensitive devices (e.g., the semiconductor chip 110 of the integrated circuit package 100). In some embodiments, the top plate 210 of the magnetic shielding structure 200 has a thickness T1 in a range of about 0.2 mm to about 1 mm. The thickness T1 within this range can provide good results, e.g., in the way of reduction of interference caused by magnetic fields (e.g., by the presence of a proximate magnet). If the thickness T1 of the top plate 210 of the magnetic shielding structure 200 is less than about 0.2 mm, the integrated circuit package 100 may be influenced by magnetic fields since the magnetic shielding structure 200 cannot provide enough shielding effect; if the thickness T1 of the top plate 210 of the magnetic shielding structure 200 is greater than about 1 mm, the size of the package structure 300 may be too large to be accommodated in the external circuities.

Similarly, the bottom plate 220 of the magnetic shielding structure 200 has a thickness T2 in a range of about 0.2 mm to about 1 mm. The thickness T2 of the bottom plate 220 may be substantially the same as the thickness T1 of the top plate 210, and the thickness T2 within this range can provide good results, e.g., in the way of reduction of interference caused by magnetic fields (e.g., by the presence of a proximate magnet).

In some other embodiments, the thickness T1 of the top plate 210 is different from the thickness T2 of the bottom plate 220. For example, the thickness T1 is greater than or smaller than the thickness T2. The values of the thicknesses T1 and T2 are determined based on a position of an external magnet disposed near the package structure 300. For example, when the external magnet is closer to the bottom plate 220 than to the top plate 210, the thickness T2 of the bottom plate 220 is thicker than the thickness T1 of the top plate 210. Optionally, if no external magnet is desired to be set at a position near the top plate 210, the top plate 210 can be made of a non-magnetic material as mentioned above. That is, the bottom plate 220 is made of a magnetic material while the top plate 210 is made of a non-magnetic material.

Similarly, when the external magnet is closer to the top plate 210 than to the bottom plate 220, the thickness T1 of the top plate 210 is thicker than the thickness T2 of the bottom plate 220. Optionally, if no external magnet is desired to be set at a position near the bottom plate 220, the bottom plate 220 can be made of a non-magnetic material as mentioned above. That is, the top plate 210 is made of a magnetic material while the bottom plate 220 is made of a non-magnetic material.

Further, in a case that a first external magnet is disposed near the top plate 210 and a second external magnet is disposed near the bottom plate 220, the thicknesses T1 and T2 are determined based on the intensities of the magnetic fields of the first and second external magnets applied to the integrated circuit package 100. For example, when the first external magnet apply a magnetic field to the integrated circuit package 100 with an intensity greater than that of a magnetic field of the second external magnet applied to the integrated circuit package 100, the thickness T1 of the top plate 210 is greater than the thickness T2 of the bottom plate 220, or vice versa.

In some embodiments, a distance between the top plate 210 and the integrated circuit package 100 is substantially equal to a distance between the bottom plate 220 and the integrated circuit package 100. In some embodiments, a distance between the top plate 210 and the semiconductor chip 110 is substantially equal to a distance between the bottom plate 220 and the semiconductor chip 110. As the distance between the top plate 210 (or the bottom plate 220)

and the integrated circuit package 100 increases, the magnetic shielding ability of the top plate 210 (or the bottom plate 220) is raised since the top plate 210 (or the bottom plate 220) can bring the magnetic field far away from the integrated circuit package 100.

In some embodiments, the distance between the top plate 210 and the integrated circuit package 100 is different from the distance between the bottom plate 220 and the integrated circuit package 100. For example, when the external magnet is closer to the top plate 210 than to the bottom plate 220, the distance between the top plate 210 and the integrated circuit package 100 is greater than the distance between the bottom plate 220 and the integrated circuit package 100, or vice versa.

In some embodiments, as shown in FIG. 3B, the magnetic shielding structure 200 is spaced apart from the integrated circuit package 100. In other words, a gap gp is between the integrated circuit package 100 and the magnetic shielding structure 200. The top plate 210 or the bottom plate 220 may be spaced apart from the integrated circuit package 100 in some embodiments. In FIG. 3B, a topmost surface of the bottom plate 220 is not in contact with the integrated circuit package 100 and is separated from the integrated circuit package 100 by an empty space es. The pillars 230 may be spaced apart from the integrated circuit package 100 in some embodiments. Therefore, the integrated circuit package 100 can move relative to the magnetic shielding structure 200. With this configuration, a distance between the top plate 210 (or the bottom plate 220) and the integrated circuit package 100 can be adjusted according to various applications.

Figure 3C:
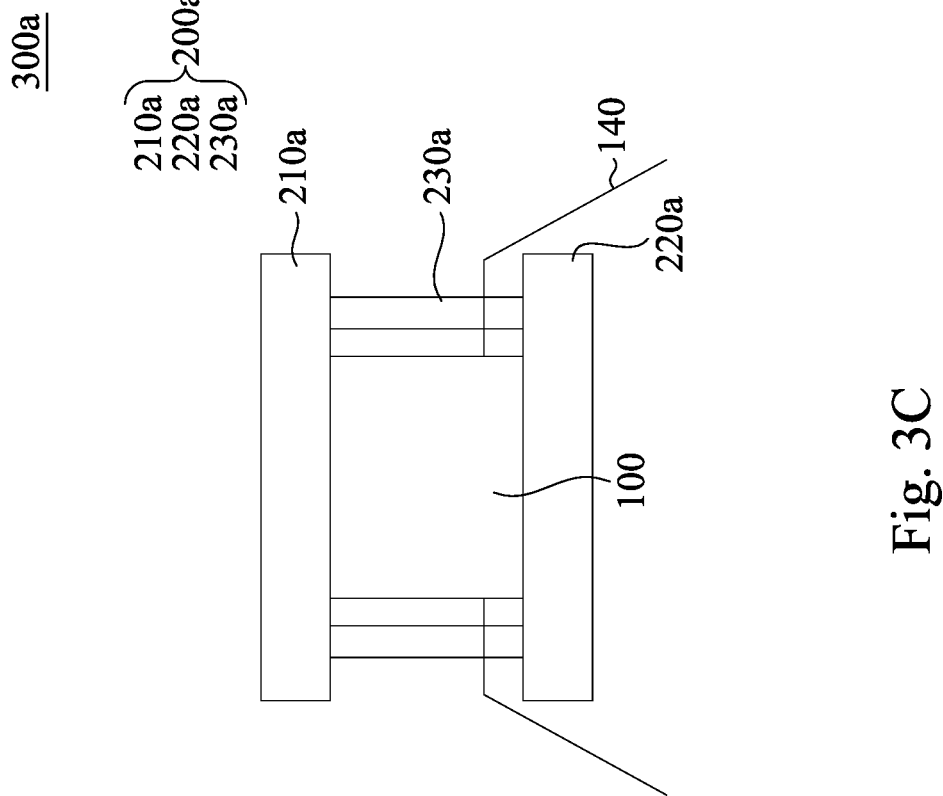
FIG. 3C is a cross-sectional view of a package structure in accordance with some embodiments of the present disclosure.

FIG. 3C is a cross-sectional view of a package structure in accordance with some embodiments of the present disclosure. As shown in FIG. 3C, the package structure 300a includes an integrated circuit package 100 and the magnetic shielding structure 200a surrounding the integrated circuit package 100. The difference between the package structure 300a in FIG. 3C and the package structure 300 in FIG. 3B pertains to configuration of the magnetic shielding structure 200a. In FIG. 3C, the magnetic shielding structure 200a is in contact with the integrated circuit package 100, and thus there is no gap between the integrated circuit package 100 and the magnetic shielding structure 200a. With this configuration, a size of the package structure 300a is reduced, such that the package structure 300a can be secured into a device with a limited accommodating space.

The magnetic shielding structure 200a includes a top plate 210a, a bottom plate 220a, and a plurality of the pillars 230a connected to the top plate 210a and the bottom plate 220b. In some embodiments, the integrated circuit package 100 is fixed or in contact with the top plate 210a and the bottom plate 220a. In some other embodiments, the integrated circuit package 100 is fixed or in contact with one of the top plate 210a and the bottom plate 220a and is spaced apart from another of the top plate 210a and the bottom plate 220a.

Figure 4B:
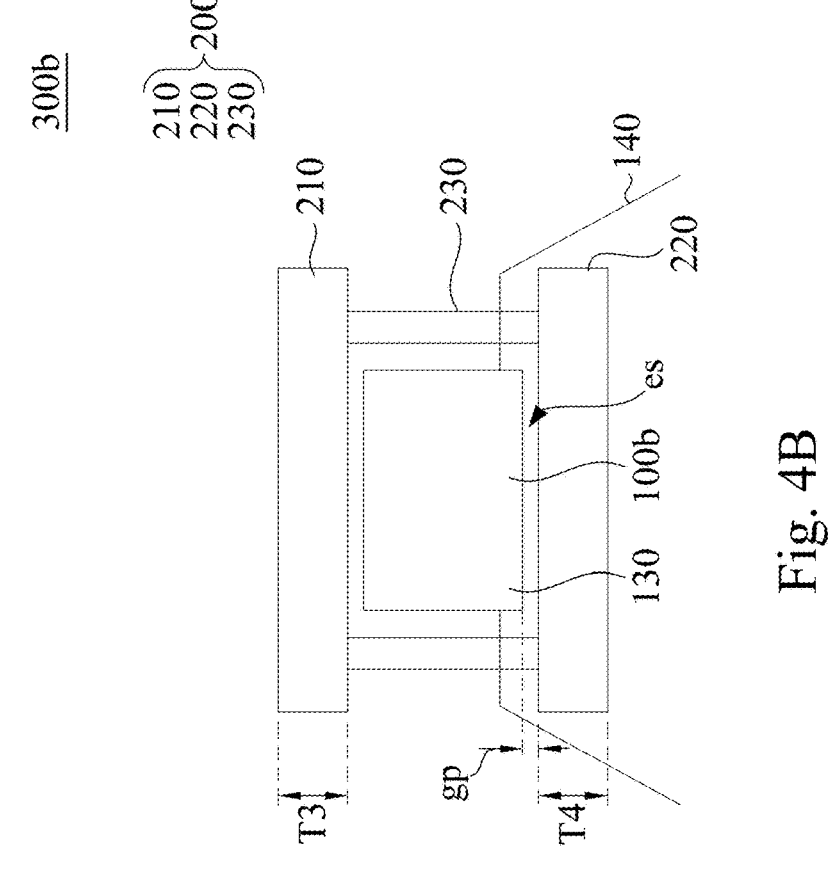
FIG. 4A and FIG. 4B are respectively top and cross-sectional views of a package structure in accordance with some embodiments of the present disclosure.
Figure 4A:
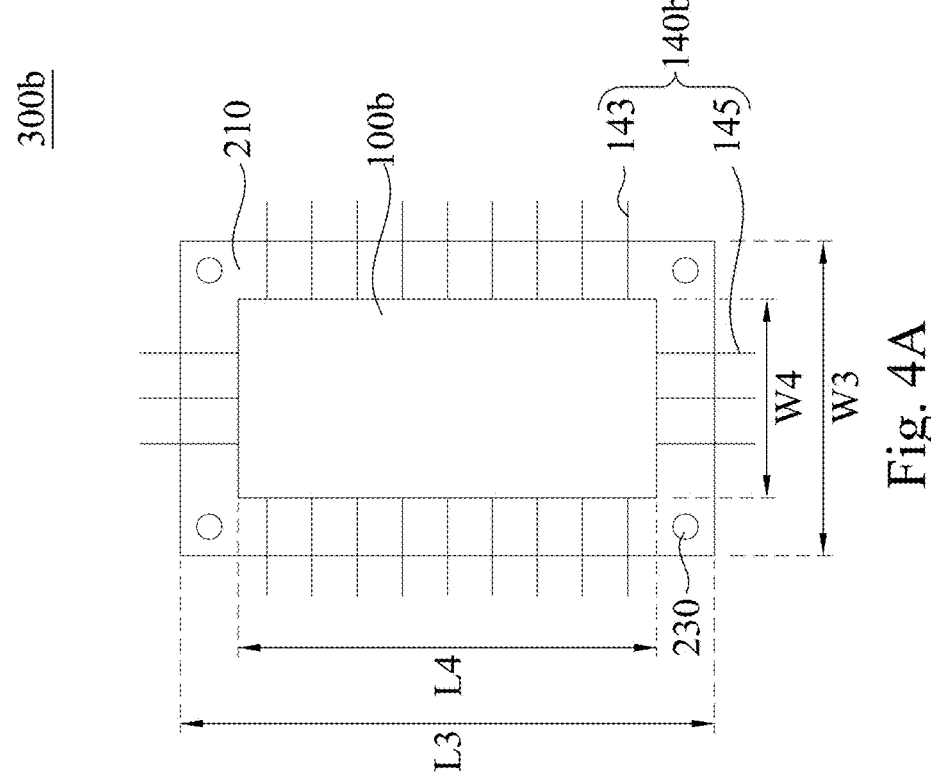

FIG. 4A and FIG. 4B are respectively top and cross-sectional views of a package structure 300b in accordance with some embodiments of the present disclosure. As shown in FIG. 4A and FIG. 4B, the package structure 300b includes an integrated circuit package 100b and the magnetic shielding structure 200 surrounding the integrated circuit package 100b. The difference between the package structure 300b in FIGS. 4A and 4B and the package structure 300 in FIGS. 3A and 3B pertains to configuration of pins 140b. In FIGS. 4A and 4B, the pins 140b have horizontal pins 143 and vertical pins 145 to electrically connect to the external circuitries.

In some embodiments, the top plate 210 of the magnetic shielding structure 200 may have a length L3 and a width W3. The length L3 and the width W3 of the magnetic shielding structure 200 in FIG. 4A may respectively correspond to (e.g., similar to or the same as) the length L1 and the width W1 of the shielding structure in FIG. 3A. The length L3 of the top plate 210 of the magnetic shielding structure 200 is greater than a length L4 of the integrated circuit package 100b in a first direction, and the width W3 of the top plate 210 of the magnetic shielding structure 200 is greater than a width W4 of the integrated circuit package 100b in a second direction perpendicular to the first direction. The length L4 and the width W4 of the integrated circuit package 100b in FIG. 4A may correspond to (e.g., similar to or the same as) the length L2 and the width W2 of the integrated circuit package 100 in FIG. 3A. With such configuration, the magnetic shielding structure 200 completely overlaps the integrated circuit package 100b.

Similarly, the bottom plate 220 of the magnetic shielding structure 200 may have a length substantially the same as the length L3 of the top plate 210 and a width substantially the same as the width W3 of the top plate 210. The length of the bottom plate 220 of the magnetic shielding structure 200 is greater than the length L4 of the integrated circuit package 100b in the first direction, and the width of the bottom plate 220 of the magnetic shielding structure 200 is greater than the width W4 of the integrated circuit package 100b in the second direction.

In some embodiments, the pillars 230 of the magnetic shielding structure 200 are disposed on the edges of the top plate 210 of the magnetic shielding structure 200. In some embodiments, the pillars 230 of the magnetic shielding structure 200 are disposed between two adjacent horizontal pins 143 or vertical pins 145.

As shown in FIG. 4B, the top plate 210 of the magnetic shielding structure 200 may has a thickness T3 to redirect magnetic flux and reduce magnetic interference on magnetic sensitive devices (e.g., semiconductor chip of the integrated circuit package 100b). In some embodiments, the thickness T3 of the top plate 210 of the magnetic shielding structure 200 is in a range of about 0.2 mm to about 1 mm. The thickness T3 within this range can provide good results, e.g., in the way of reduction of interference caused by magnetic fields (e.g., by the presence of a proximate magnet). If the thickness T3 of the top plate 210 of the magnetic shielding structure 200 is less than about 0.2 mm, the integrated circuit package 100b may be influenced by magnetic fields since the magnetic shielding structure 200 cannot provide enough shielding effect; if the thickness T3 of the top plate 210 of the magnetic shielding structure 200 is greater than about 1 mm, the size of the package structure 300b may be too large to be accommodated in the external circuities.

Similarly, the bottom plate 220 of the magnetic shielding structure 200 has a thickness T4 in a range of about 0.2 mm to about 1 mm. The thickness T4 of the bottom plate 220 may be substantially the same as the thickness T3 of the top plate 210, and the thickness T4 within this range can provide good results, e.g., in the way of reduction of interference caused by magnetic fields (e.g., by the presence of a proximate magnet).

In some embodiments, as shown in FIG. 4B, the magnetic shielding structure 200 is spaced apart from the integrated circuit package 100b. In other words, a gap gp is between the integrated circuit package 100b and the magnetic shielding structure 200. In FIG. 4B, a topmost surface of the bottom plate 220 is not in contact with the integrated circuit package 100 and is separated from the integrated circuit package 100 by an empty space es.

In some other embodiments, similar to the configuration of the magnetic shielding structure 200a in FIG. 3C, the magnetic shielding structure 200 in FIG. 4A and FIG. 4B may be fixed in or in contact with the integrated circuit package 100b, and thus there is no gap between the integrated circuit package 100b and the magnetic shielding structure 200.

Figure 5:
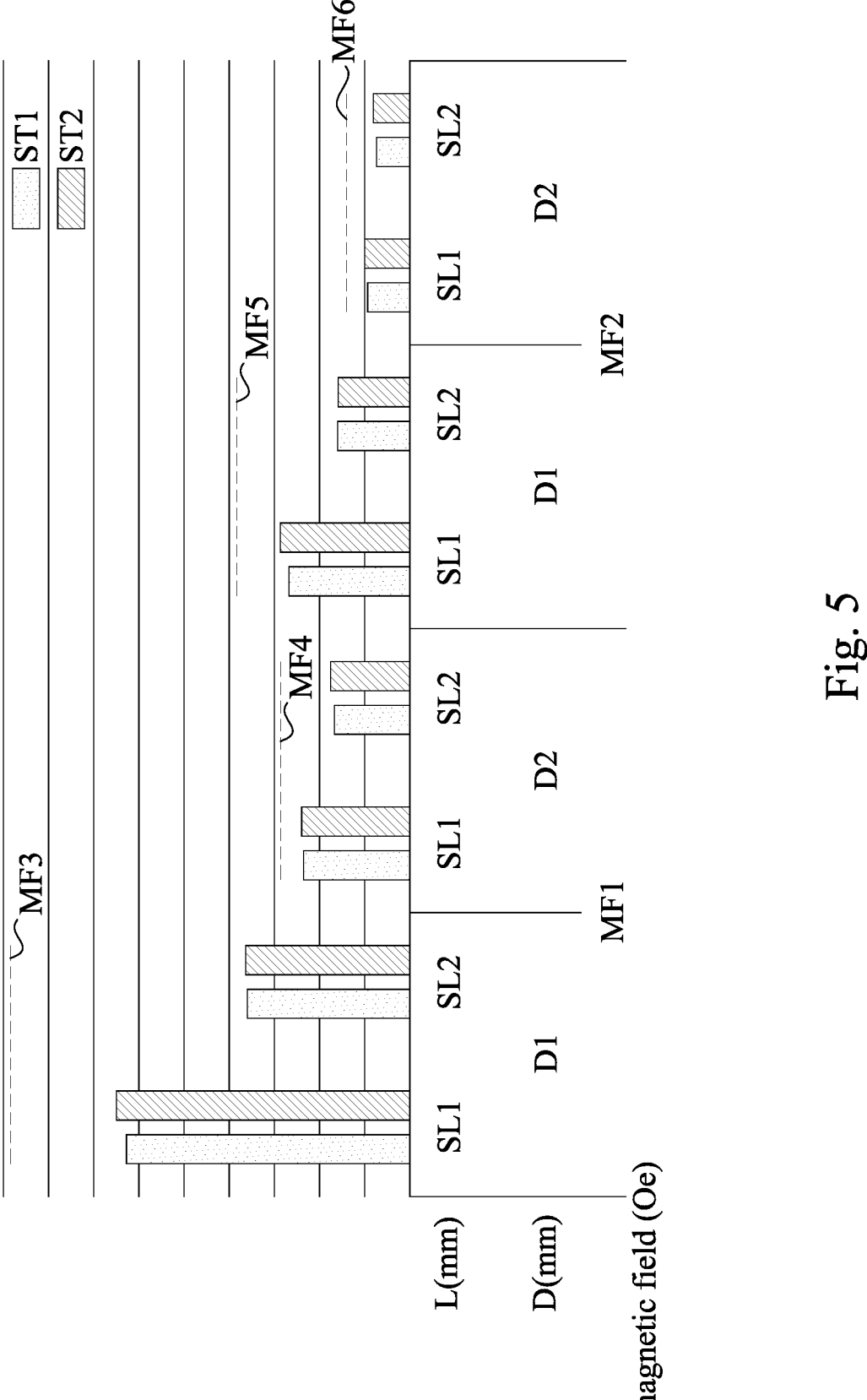
FIG. 5 is a diagram to illustrate the package structure under various dimensions of magnetic shielding structures of the package structure in accordance with some embodiments of the present disclosure.

FIG. 5 is a diagram to illustrate the package structure under various dimensions of magnetic shielding structures of the package structure. In FIG. 5, the diagram shows different results when the shielding structures respectively have a thickness ST1 or ST2. A magnet may be disposed adjacent to the package structure and generate external magnetic field. The magnetic shielding structure surrounds the integrated circuit package may shield the integrated circuit package from magnetic interference or the like, for example, as may be caused by a magnet brought into proximity of the package structure. In some embodiments, the package structure, the magnetic shielding structure, and the integrated circuit package respectively correspond to the package structure 300, the magnetic shielding structure 200, and the integrated circuit package 100 in FIGS. 1-3B, and materials, configurations, dimensions, processes and/or operations regarding the package structure, the magnetic shielding structure, and the integrated circuit package are similar to or the same as those in FIGS. 1-3B, and, therefore, a description in this regard will not be repeated hereinafter. In some other embodiments, the package structure, the magnetic shielding structure, and the integrated circuit package respectively correspond to the package structure 300a, the magnetic shielding structure 200a, and the integrated circuit package 100 in FIG. 3C, and materials, configurations, dimensions, processes and/or operations regarding the package structure, the magnetic shielding structure, and the integrated circuit package are similar to or the same as those in FIG. 3C, and, therefore, a description in this regard will not be repeated hereinafter. In still some other embodiments, the package structure, the magnetic shielding structure, and the integrated circuit package respectively correspond to the package structure 300b, the magnetic shielding structure 200, and the integrated circuit package 100b in FIGS. 4A and 4B, and materials, configurations, dimensions, processes and/or operations regarding the package structure, the magnetic shielding structure, and the integrated circuit package are similar to or the same as those in FIGS. 4A and 4B, and, therefore, a description in this regard will not be repeated hereinafter.

In some embodiments, the thickness ST1 of the magnetic shielding structure is smaller than the thickness ST2 of the magnetic shielding structure. For example, the thickness ST1 of the magnetic shielding structure is about 0.2 mm, and the thickness ST2 of the magnetic shielding structure is about 0.3 mm.

A term "L" may represent a length of the magnetic shielding structure. When the term "L" is greater, the effect for shielding magnetic field may be improved. In some embodiments, a length SL1 of the magnetic shielding structure is smaller than a length SL2 of the magnetic shielding structure, such that the magnetic field at a central of the semiconductor chip (e.g., the semiconductor chip 110 in FIG. 1) when the magnetic shielding structure has the length SL1 is greater than the magnetic field at the central of the semiconductor chip (e.g., the semiconductor chip 110 in FIG. 1) when the magnetic shielding structure has the length SL2. In some embodiments, the length SL1 is smaller than a length of the magnet, and the length SL2 is greater than the length of the magnet. The length SL1 may be about 4 mm, and the length SL2 may be about 6 mm.

A term "D" may represent a distance between the semiconductor chip (e.g., the semiconductor chip 110 in FIG. 1) and the magnet. When the term "D" is smaller, the magnetic interference of the semiconductor chip caused by the magnet may be greater. In some embodiments, a distance D1 is smaller than a distance D2. For example, the distance D1 is about 1 mm, and the distance D2 is about 3 mm.

A term "magnetic field" may represent a magnetic field on a surface of the magnet and would influence the integrated circuit package. In some embodiments, a magnetic field MF1 is greater than a magnetic field MF2. For example, the magnetic field MF1 is about 3500 Oe, and the magnetic field MF2 is about 1500 Oe.

With different dimensions of the magnetic shield structure, a length (e.g., the length SL2) may have a positive relationship to the magnetic shielding ability (e.g., a reduction of the magnetic field) of the magnetic shield structure. When the external magnet is disposed adjacent to the package structure by the distance D1 and the magnetic field on the surface of the external magnet has a value MF1, a magnetic field at a central of the integrated circuit package (especially the semiconductor chip of the integrated circuit package) has a value MF3 without the magnetic shield structure. The magnetic shielding structure can shield the integrated circuit package from magnetic interference. For example, the magnetic field at the center of the integrated circuit package is lower than the value MF3 when the magnetic shield structure having the length of SL1, and the magnetic field at the center of the integrated circuit package is also lower than the value MF3 when the magnetic shield structure having the length of SL2. As such, the shielding effect is achieved.

In some embodiments, when the external magnet is disposed adjacent to the package structure by a distance D2 greater than the distance D1 and the magnetic field on the surface of the external magnet has a value MF1, a magnetic field at the central of the integrated circuit package (especially the semiconductor chip of the integrated circuit package) has a value MF4 without the magnetic shield structure. The magnetic field at the center of the integrated circuit package is lower than the value MF4 when the magnetic shield structure having the length of SL1, and the magnetic field at the center of the integrated circuit package also lower than the value MF4 when the magnetic shield structure having the length of SL2. In some other embodiments, when the external magnet is disposed adjacent to the package structure by the distance D1 and the magnetic field on the surface of the external magnet has a value MF2, a magnetic field at the central of the integrated circuit package (especially the semiconductor chip of the integrated circuit package) has a value MF5 without the magnetic shield structure. The magnetic field at the center of the integrated circuit package is lower than the value MF5 when the magnetic shield structure having the length of SL1, and the magnetic field at the center of the integrated circuit package is also lower than the value MF5 when the magnetic shield structure having the length of SL2. In still some other embodiments, when the external magnet is disposed adjacent to the package structure by the distance D2 greater than the distance D1 and the magnetic field on the surface of the external magnet has a value MF2, a magnetic field at the central of the integrated circuit package (especially the semiconductor chip of the integrated circuit package) has a value MF6 without the magnetic shield structure. The magnetic field at the center of the integrated circuit package is lower than the value MF6 when the magnetic shield structure having the length of SL1, and the magnetic field at the center of the integrated circuit package is also lower than the value MF6 when the magnetic shield structure having the length of SL2. As such, the magnetic shielding structure can shield the integrated circuit package from magnetic interference and thus the amount of the magnetic field at the center of the integrated circuit package can be reduced.

Illustrated in FIG. 6 is a flow chart of a method 400 of manufacturing a package structure in accordance with some embodiments of the present disclosure. The method 400 is merely an example and is not intended to limit the present disclosure beyond what is explicitly recited in the claims. Additional operations can be provided before, during, and after the method 400, and some operations described can be replaced, eliminated, or moved around for additional embodiments of the process. In some embodiments, the method 400 corresponds to the method of manufacturing the package structure 300 in FIGS. 3A and 3B, the package structure 300a in FIG. 3C, and/or the package structure 300b in FIGS. 4A and 4B. In operation 410 of the method 400, an integrated circuit package is provided. For example, in FIG. 1, the integrated circuit package 100 includes the semiconductor chip 110, a plurality of pins 140, and the molding material 130. Each of the pins 140 is electrically connected to the semiconductor chip 110 by one of the bonding wires 150. The molding material 130 surrounds the semiconductor chip 110. Each of the pins 140 extends outside the molding material 130.

The method 400 proceeds to operation 420 where a magnetic shielding structure is formed. The magnetic shielding structure includes a top plate and a bottom plate. For example, in FIGS. 2, 3A and 3B, the magnetic shielding structure 200 including the top plate 210 and the bottom plate 220 is formed. In some embodiments, a thickness of the top plate or a thickness the bottom plate is determined based on a relative position of an external magnet and the integrated circuit package as shown in operation 415. For example, in FIG. 3B, the thickness T1 of the top plate 210 or the thickness the bottom plate 220 can be determined based on the relative position of the external magnet and the integrated circuit package 100. When the external magnet is closer to the top plate 210 than to the bottom plate 220, the thickness T1 of the top plate 210 may be determined to be thicker than the thickness T2 of the bottom plate 220.

The method 400 proceeds to operation 430 where the integrated circuit package is secured between the top plate and the bottom plate. For example, in FIGS. 1, 2, 3A and 3B, the integrated circuit package 100 is secured between the top plate 210 and the bottom plate 220 of the magnetic shielding structure 200, such that the top plate 210 is disposed over a surface of the integrated circuit package 100 (or a surface of the semiconductor chip in some cases) and the bottom plate 220 is disposed over an opposite surface of the integrated circuit package 100 (or an opposite surface of the semiconductor chip in some cases). The pins 140 of the integrated circuit package 100 may be used to fix the integrated circuit package 100 inside the magnetic shielding structure 200, and the integrated circuit package 100 does not detach from the magnetic shielding structure 200.

The method 400 proceeds to operation 440 where a plurality of pillars are fixed on edges of the top plate and the bottom plate. For example, in FIGS. 2, 3A and 3B, the pillars 230 are fixed on edges of the top plate 210 and the bottom plate 220 after securing the integrated circuit package 100 between the top plate 210 and the bottom plate 220. In some embodiments, the pillars 230 are spaced apart from the pins 140.

In some embodiments, the integrated circuit package 100 is disposed over the bottom plate 220, and then an end of each of the pillars 230 is fixed on each of the edges of the bottom plate 220. Thereafter, the top plate 210 is fixed on the other end of each of the pillars 230, such that the integrated circuit package 100 is disposed in the magnetic shielding structure 200. In some other embodiments, the top plate 210 and the bottom plate 220 form the accommodate space 240, and the integrated circuit package 100 is disposed between the bottom plate 220 and the top plate 210. Thereafter, the pillars 230 is fixed on and connected to the edges of the bottom plate 220 and the top plate 210.

Based on the above discussions, it can be seen that the present disclosure offers advantages. It is understood, however, that other embodiments may offer additional advantages, and not all advantages are necessarily disclosed herein, and that no particular advantages are required for all embodiments. One advantage is that the magnetic shielding structure surrounding the integrated circuit package can reduce interface at the semiconductor chip caused by an external magnetic field. Another advantage is that the magnetic shielding structure is suitable for all types of the integrated circuit package.

According to some embodiments, a package structure includes an integrated circuit package and a magnetic shielding structure. The integrated circuit package includes a semiconductor chip. The magnetic shielding structure surrounds the integrated circuit package, in which the magnetic shielding structure including a top plate and a bottom plate disposed on two opposite sides of the integrated circuit package.

According to some embodiments, a package structure includes a conductive pad, a semiconductor chip, a molding material, and a magnetic shielding structure. The semiconductor chip is disposed on the conductive pad. The molding material surrounds the conductive pad and the semiconductor chip. The magnetic shielding structure includes a top plate and a bottom plate, in which the top plate is disposed over a surface of the semiconductor chip and the bottom plate is disposed over an opposite surface of the semiconductor chip.

According to some embodiments, a method of manufacturing a package structure includes providing an integrated circuit package. The integrated circuit package includes a semiconductor chip, a pin, and a molding material. The pin is electrically connected to the semiconductor chip. The molding material surrounds the semiconductor chip, in which the pin extends outside the molding material. A magnetic shielding structure is formed and the magnetic shielding structure includes a top plate and a bottom plate. The integrated circuit package is secured between the top plate and the bottom plate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing an integrated circuit package comprising:
   a semiconductor chip;
   a pin electrically connected to the semiconductor chip; and
   a molding material surrounding the semiconductor chip, wherein the pin extends outside the molding material;
   forming a magnetic shielding structure comprising a top plate and a bottom plate;
   disposing the integrated circuit package between the top plate and the bottom plate, wherein after disposing integrated circuit package between the top plate and the bottom plate, the molding material of the integrated circuit package is separated from the top plate and the bottom plate by gaps, wherein a topmost surface of the bottom plate is not in contact with the integrated circuit package and is separated from the integrated circuit package by an empty space;
   after disposing the integrated circuit package between the top plate and the bottom plate, fixing a plurality of non-magnetic pillars on edges of the top plate and the bottom plate, wherein top ends of the non-magnetic pillars are in contact with the top plate and bottom ends of the non-magnetic pillars are in contact with the bottom plate; and
   adjusting a position of the integrated circuit package between the top plate and the bottom plate of the magnetic shielding structure based on a relative position of a magnet and the integrated circuit package.

2. The method of claim 1, wherein the non-magnetic pillars are spaced apart from the pin.

3. The method of claim 1, further comprising determining a thickness of the top plate based on a relative position of a magnet and the integrated circuit package.

4. The method of claim 1, wherein the integrated circuit package further comprises a bonding wire having a first end in contact with the semiconductor chip and a second end in contact with the pin.

5. The method of claim 1, wherein the integrated circuit package further comprises:
   a conductive pad; and
   an adhesive layer, wherein the semiconductor chip is attached to the conductive pad by the adhesive layer.

6. The method of claim 1, wherein a height of the pin is greater than a distance between the top plate and the bottom plate.

7. The method of claim 1, wherein a height of the empty space is less than a height of the integrated circuit package.

8. A method, comprising:
   providing an integrated circuit package comprising:
   a semiconductor chip comprising a magnetic random access memory (MRAM); and
   a molding material surrounding the semiconductor chip;
   disposing a top plate of a magnetic shielding structure over the integrated circuit package, wherein the top plate overlaps an entirety of the molding material;
   disposing a bottom plate of the magnetic shielding structure below the integrated circuit package;
   disposing a plurality of pillars between the top plate and the bottom plate of the magnetic shielding structure, wherein the pillars are in contact with a bottom surface of the top plate and a top surface of the bottom plate, wherein a topmost surface of the bottom plate is not in contact with the integrated circuit package and is separated from the integrated circuit package by an empty space, the molding material of the integrated circuit package is movable relative to the pillars after disposing the pillars between the top plate and the bottom plate of the magnetic shielding structure; and adjusting a position of the integrated circuit package between the top plate and the bottom plate of the magnetic shielding structure based on a relative position of a magnet and the integrated circuit package.

9. The method of claim 8, wherein a thickness of the top plate of the magnetic shielding structure is different from a thickness of the bottom plate of the magnetic shielding structure.

10. The method of claim 8, wherein the pillars comprise a different material from the top plate of the magnetic shielding structure.

11. The method of claim 8, wherein the pillars comprise plastic, stainless steel, ceramic, or combinations thereof.

12. The method of claim 8, wherein disposing the pillars between the top plate and the bottom plate of the magnetic shielding structure is performed such that the pillars are spaced apart from the integrated circuit package.

13. The method of claim 8, wherein disposing the top plate of the magnetic shielding structure over the integrated circuit package is performed such that the top plate of the magnetic shielding structure is spaced apart from the integrated circuit package.

14. The method of claim 8, wherein an area of a top surface of the top plate of the magnetic shielding structure is greater than an area of a top surface of the integrated circuit package.

15. The method of claim 8, wherein a length of the top plate of the magnetic shielding structure is greater than a length of the integrated circuit package.

16. The method of claim 8, wherein an entirety of the molding material overlaps the bottom plate.

17. The method of claim 8, wherein the top plate and the bottom plate are electrical steel.

18. A method, comprising:

providing an integrated circuit package comprising:
  a semiconductor chip comprising a magnetic random access memory (MRAM); and
  a molding material surrounding the semiconductor chip;

disposing a bottom plate of a magnetic shielding structure below the integrated circuit package, such that a topmost surface of the bottom plate of the magnetic shielding structure is not in contact with the molding material of the integrated circuit package;

disposing a top plate of the magnetic shielding structure over the integrated circuit package, wherein after disposing integrated circuit package between the top plate and the bottom plate, the molding material of the integrated circuit package is separated from the top plate and the bottom plate by gaps, wherein the topmost surface of the bottom plate is not in contact with the integrated circuit package and is separated from the integrated circuit package by an empty space;

disposing a plurality of pillars of the magnetic shielding structure between the top plate and the bottom plate, wherein top ends of the pillars are in contact with the top plate and bottom ends of the pillars are in contact with the bottom plate, and wherein from a top view, an area of the top plate is larger than an area of molding material; and adjusting a position of the integrated circuit package between the top plate and the bottom plate of the magnetic shielding structure based on a relative position of a magnet and the integrated circuit package.

19. The method of claim 18, wherein the bottom plate of the magnetic shielding structure comprises copper, molybdenum, carbon, silicon, chromium, niobium, titanium, manganese, aluminum, tungsten, vanadium, or combinations thereof.

20. The method of claim 18, wherein the topmost surface of the bottom plate is separated from the integrated circuit package by an empty space.

* * * * *